(12) United States Patent
Kim

(10) Patent No.: US 7,294,523 B2
(45) Date of Patent: *Nov. 13, 2007

(54) METHOD FOR FABRICATING CMOS IMAGE SENSOR

(75) Inventor: In Su Kim, Choongcheongbukdo (KR)

(73) Assignee: Donogbu Electronics Co., Ltd, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/320,482

(22) Filed: Dec. 29, 2005

(65) Prior Publication Data

US 2006/0148160 A1    Jul. 6, 2006

(30) Foreign Application Priority Data

Dec. 30, 2004    (KR) ............. 10-2004-0116414

(51) Int. Cl.
H01L 21/00    (2006.01)

(52) U.S. Cl. ............... 438/57; 257/E31.001

(58) Field of Classification Search ........ 438/57, 438/65, 66, 69, 73, 153, 154, 199, 618, 702, 438/707, 710, 711, 723, 724
See application file for complete search history.

(56) References Cited

U.S. PATENT DOCUMENTS 6,171,883 B1 *    1/2001  Fan et al. ............. 438/65
6,307,243 B1 *  10/2001  Rhodes ............. 257/432
6,362,498 B2 *    3/2002  Abramovich ............. 257/233
6,379,992 B2 *    4/2002  Jo ............. 438/70
6,686,294 B2 *    2/2004  Kawai ............. 438/714
2005/0139832 A1*  6/2005  Jeon ............. 257/69
2005/0274968 A1* 12/2005  Kuo et al. ............. 257/98
2006/0141647 A1*  6/2006  Kim ............. 438/27

FOREIGN PATENT DOCUMENTS

KR    10-2001-0004114    1/2001
KR    10-20010083208    8/2001

* cited by examiner

Primary Examiner—Scott B. Geyer
Assistant Examiner—Reema Patel
(74) Attorney, Agent, or Firm—McKenna Long & Aldridge LLP

(57) ABSTRACT

In a method for fabricating a CMOS image sensor, microlenses are formed with a silicon nitride layer formed on a pad such that it is possible to decrease a height of microlens and to improve a refraction ratio. In addition to main lenses in shape of curved surface, inner lenses are formed in shape of a sidewall spacer by etching oxide and nitride layers at a high etching selection ratio.

13 Claims, 4 Drawing Sheets

METHOD FOR FABRICATING CMOS IMAGE SENSOR

CROSS REFERENCE TO RELATED APPLICATION

This application claims the benefit of Korean Patent Application No. 10-2004-0116414 filed on Dec. 30, 2004, which is hereby incorporated by reference as if fully set forth herein.

BACKGROUND OF THE INVENTION

1. Field of the Invention

The present invention relates to a method for fabricating a CMOS image sensor.

2. Discussion of the Related Art

Referring to FIGS. 1A and 1B, illustrating a CMOS image sensor, a metal line 1a is formed on a sub-layer 1, and then an etching process is performed to form a pad open. Subsequently, a pad layer 2 is formed on the sub-layer 1, and then a color filter array 3 is formed on the pad layer 2. A planar layer 4 is then formed on the color filter array 3, and a microlens 6 is formed.

The microlens 6 is formed with a reflow process using a photoresist 5 formed on the planar layer 4. However, a pad aluminum portion 2a, which is opened as shown in FIG. 1A, may be contaminated when performing a photo process. As such, the contaminated portion becomes a particle source.

When fabricating the CMOS image sensor, the final processing steps are related to the processes for forming the color filter array and the microlens. As explained above, the microlens are formed with the reflow method utilizing a photoresist.

However, this reflow method has difficulty forming a curved surface. As the size of microlens decreases, the radius of microlens also decreases. Thus, the height of microlens must be lowered, which can be difficult with the reflow method utilizing the photoresist.

SUMMARY OF THE INVENTION

Accordingly, the present invention is directed to a method for fabricating a CMOS image sensor that substantially obviates one or more disclosed or undisclosed problems or issues that may due to limitations and disadvantages of the related art.

The present invention may include a method for fabricating a CMOS image sensor that improves the integration of microlens.

The present invention may also include a method for fabricating a CMOS image sensor that improves the preciseness in forming microlens.

Additional advantages, objects, and features of the invention will be set forth in part in the description which follows and in part will become apparent to those having ordinary skill in the art upon examination of the following. These and other advantages of the invention may be realized and attained by the structure particularly pointed out in the written description and claims as well as the appended drawings.

To achieve these and other advantages in accordance with the invention, as embodied and broadly described herein, a method for fabricating a CMOS image sensor includes forming a metal line pattern; forming a pad layer on the metal line pattern; forming a passivation layer on the pad layer; etching the passivation layer with a photoresist mask for microlens; sequentially forming a silicon oxide layer and a silicon nitride layer on the etched passivation layer for the formation of microlenses; and forming dual-structure microlenses in the surface of the etched passivation layer and at inner sidewalls of the etched passivation layer by etching the silicon oxide layer and the silicon nitride layer at a high etching selection ratio.

The microlenses can be formed on the metal line, whereby the light is concentrated without a light-scattering phenomenon. Accordingly, the inner microlenses of sidewall spacer photoresist may be formed at any portion of the metal line.

In addition to the microlenses, inner microlenses are formed at inner sidewalls of the silicon nitride layer. Both oxide and nitride layers are used for the microlenses, thereby improving the refraction ratio.

With the high etching selection ratio of the silicon oxide layer to the silicon nitride layer, the inner lenses as well as the main lenses can be formed, wherein the main lenses are formed in the curved surface, and the inner lenses are formed in the shape of a spacer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention illustrate embodiments of the invention, and together with the description, serve to explain the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

FIGS. 2A-2D show the process for fabricating a CMOS image sensor according to the present invention.

Figure 1A:
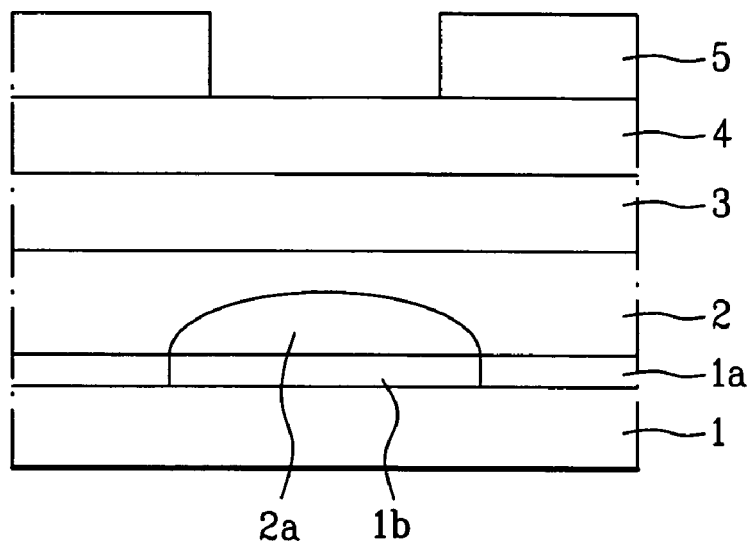
FIGS. 1A and 1B are cross-sectional views for illustrating a method for fabricating a CMOS image sensor according to the related art.
Figure 1B:
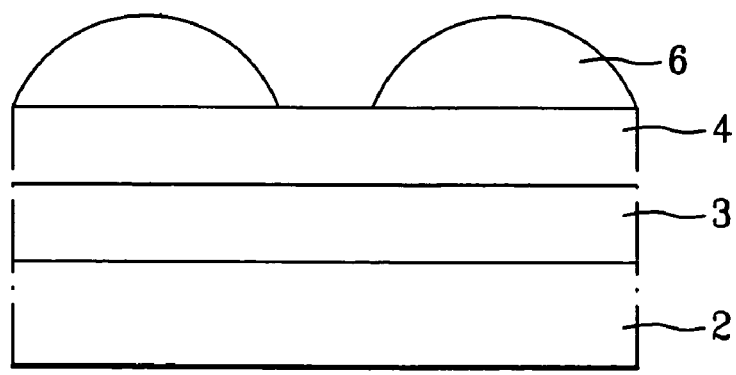
Figure 2A:
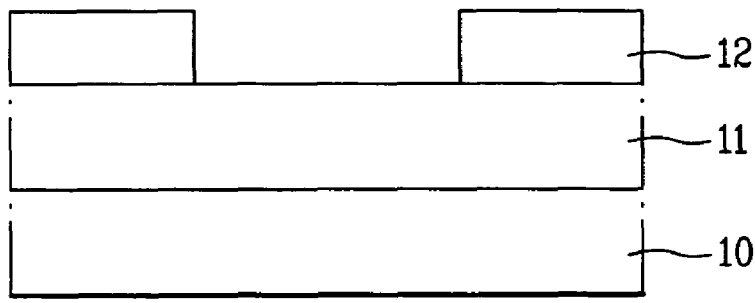
FIGS. 2A-2D are cross-sectional views for illustrating a method for fabricating a CMOS image sensor according to the present invention.

As shown in FIG. 2A, a silicon nitride layer 11 is formed on a pad layer 10, wherein the silicon nitride layer 11 functions as a passivation layer. Then, a photoresist mask 12 is provided on the passivation layer by patterning.

Figure 2B:
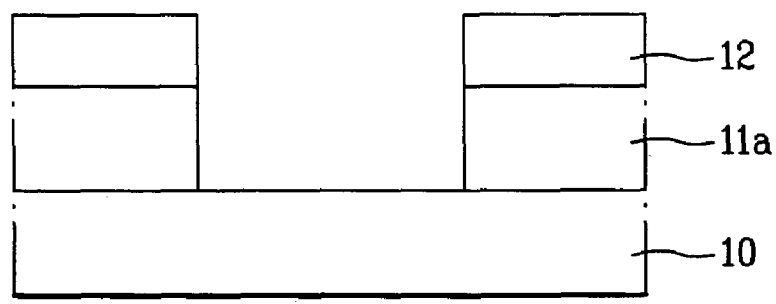

As shown in FIG. 2B, the exposed portion of the silicon nitride layer 11 is etched with the photoresist mask 12, thereby realizing a desired pattern 11a of silicon nitride layer.

Figure 2C:
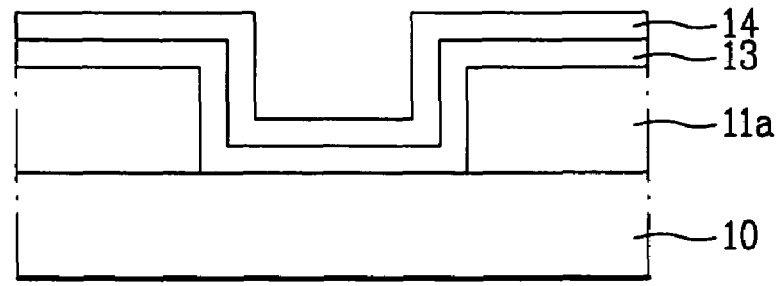

As shown in FIG. 2C, after removing the photoresist mask 12, a silicon oxide layer 13 and a silicon nitride layer 14 are sequentially formed on the remaining silicon nitride layer 11a of the desired pattern. Alternatively, layer 14 can be a nitride layer instead of a silicon nitride layer. Microlenses are formed in a predetermined shape, as in performing the etching process of the silicon oxide layer 13 and the silicon nitride layer 14. It can be difficult to form the microlenses at a general etching selection ratio of the silicon oxide layer 13 to the silicon nitride layer 14, for example, SiN:SiO$_2$=1:1.

In addition to the microlenses, inner microlenses are additionally formed at inner sidewalls of the silicon nitride layer 11a.

To form the oxide layer spacers of the inner microlenses at both inner sidewalls inside the pattern of silicon nitride layer 11a, it is necessary to obtain the high etching selection ratio of the silicon oxide layer 13 and the silicon nitride layer 14. Optimal process conditions are necessary to form the inner microlenses that realize the high etching selection ratio of the silicon oxide layer 13 and the silicon nitride layer 14. If a CF$_4$ and Ar gas mixture is utilized according to the related art process conditions, it is very difficult to obtain the desired high etching selection ratio.

The present invention can employ HBr/Cl$_2$/O$_2$ gas to obtain the high etching selection ratio. In one embodiment, the high etching selection ratio is obtained under conditions of etchant flow rates of 20-50 sccm (HBr), 100-200 sccm (Cl$_2$), and 10-20 sccm (SF$_6$); an RF power of 200-500 W; and a pressure of 100-200 mTorr. Under these conditions, when etching the silicon oxide layer 13 and the silicon nitride layer 14, it is possible to obtain the desired high etching selection ratio of the silicon nitride layer 14 to the silicon oxide layer 13, for example, above 20:1.

Figure 2D:
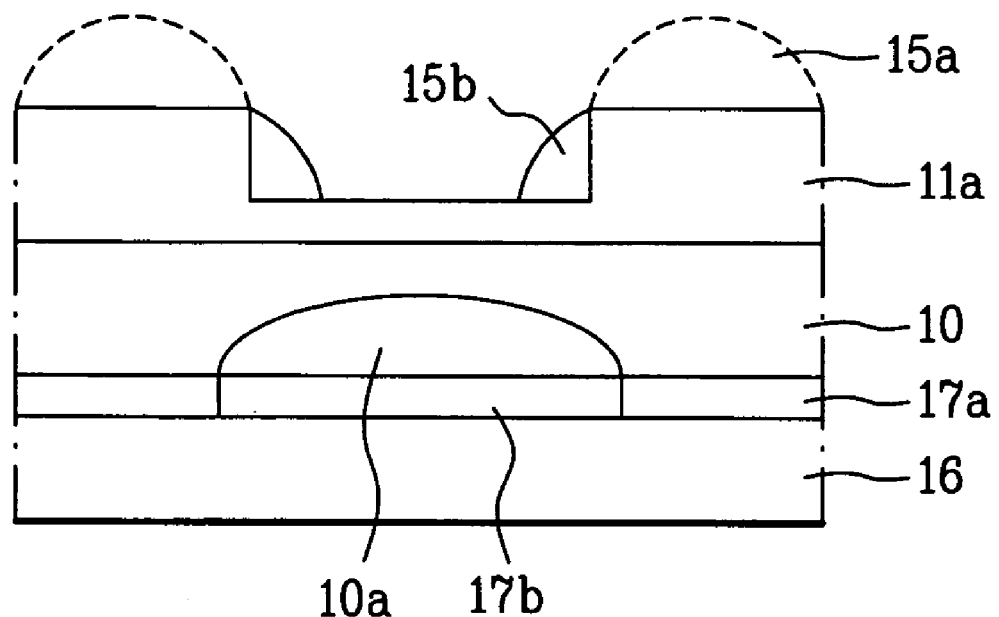

As shown in FIG. 2D, the microlenses 15a are formed on the surface of the passivation layer 11a, wherein each of the microlenses 15a is formed in shape of the curved surface. In addition, the inner microlenses 15b are formed at both inner sidewalls inside the pattern of the passivation layer 11a, wherein the inner microlenses 15b are formed as the sidewall spacers. A sub-layer 16 is formed under the pad layer 10, and then a metal line 17a having an open region 17b is formed on the sub-layer. After forming the pad layer 10, an aluminum pad portion 10a is formed at a lower side of the pad layer 10 corresponds to the open region 17b.

Figure 3:
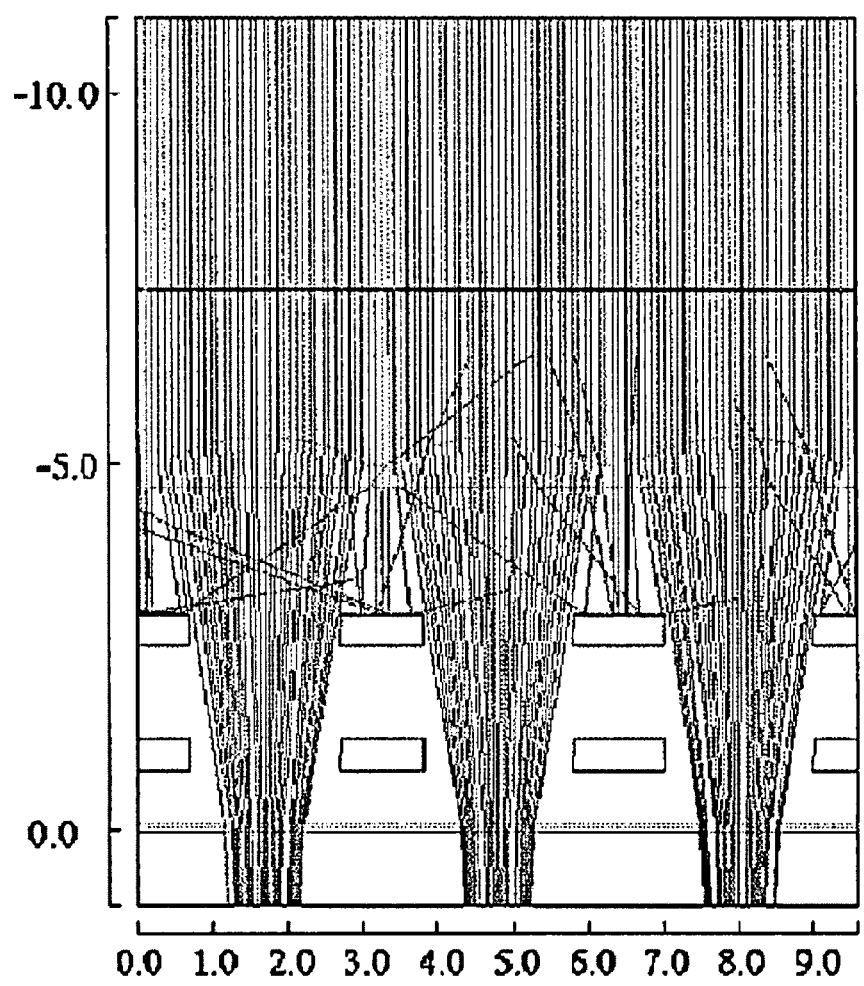
FIG. 3 is a diagram illustrating the state of CMOS image sensor from which the light-scattering phenomenon is removed.

FIG. 3 shows the characteristics of an exemplary embodiment of a CMOS image sensor in accordance with the present invention in which microlenses are formed on the metal line. As shown in FIG. 3, the light is concentrated without any light-scattering phenomenon. Accordingly, the inner microlenses of sidewall spacer photoresist 13a may be formed at any portion of the metal line.

As described above, the method for fabricating the CMOS image sensor according to the present invention enables the microlens radius to be decreased and lens integration to be improved by using the dual-lens structure. In addition, since the total height of microlens decreases, microlens precision can also be improved. Moreover, since the microlenses are formed with the oxide layer and the nitride layer, the microlens radius can be set as desired.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method for fabricating a CMOS image sensor, comprising:
   forming a metal line pattern;
   forming a pad layer on the metal line pattern;
   forming a passivation layer on the pad layer;
   etching the passivation layer with a photoresist mask for microlenses;
   sequentially forming a silicon oxide layer and a silicon nitride layer on the etched passivation layer; and
   forming dual-structure microlenses on the surface of the etched passivation layer and at inner sidewalls of the etched passivation layer by etching the silicon oxide layer and the silicon nitride layer at a high etching selection ratio.

2. The method of claim 1, wherein the passivation layer is formed of silicon nitride.

3. The method of claim 1, wherein an etching gas for the silicon oxide layer and the silicon nitride layer is formed of HBr/Cl$_2$/O$_2$.

4. The method of claim 1, wherein the etching of the silicon oxide layer and the silicon nitride layer step is performed under conditions of etchant flow rates of 20-50 sccm for HBr, 100-200 sccm for Cl$_2$, and 10-20 sccm for SF$_6$; an RF power of 200-500 W; and a pressure of 100-200 mTorr.

5. The method of claim 1, wherein the etching selection ratio of the silicon oxide layer to the silicon nitride layer is about 1:20.

6. The method of claim 1, further comprising:
   forming a sub-layer under the pad layer;
   forming a metal line having an open region on the sub-layer; and
   forming an aluminum pad portion at a lower side of the pad layer in correspondence with the open region.

7. A method for fabricating a CMOS image sensor, comprising:
   forming a metal line pattern;
   forming a pad layer on the metal line pattern;
   forming a passivation layer on the pad layer;
   etching the passivation layer with a photoresist mask for microlenses;
   sequentially forming a silicon oxide layer and a silicon nitride layer on the etched passivation layer;
   forming dual-structure microlenses in the surface of the etched passivation layer and at inner sidewalls of the etched passivation layer by etching the silicon oxide layer and the silicon nitride layer at a high etching selection ratio;
   forming a sub-layer under the pad layer;
   forming a metal line having an open region on the sub-layer; and
   forming an aluminum pad portion at a lower side of the pad layer in correspondence with the open region.

8. The method of claim 7, wherein the passivation layer is formed of silicon nitride.

9. The method of claim 7, wherein an etching gas for the silicon oxide layer and the silicon nitride layer is formed of HBr/Cl$_2$/O$_2$.

10. The method of claim 7, wherein the etching of the silicon oxide layer and the silicon nitride layer is performed under conditions of etchant flow rates of 20-50 sccm for HBr, 100-200 sccm for Cl$_2$, and 10-20 sccm for SF$_6$; an RF power of 200-500 W; and a pressure of 100-200 mTorr.

11. The method of claim 7, wherein the etching selection ratio of the silicon oxide layer to the silicon nitride layer is about 1:20.

12. A CMOS image sensor formed in accordance with the method of claim 1.

13. A CMOS image sensor formed in accordance with the method of claim 7.

* * * * *